(12) United States Patent
Kishi et al.

(10) Patent No.: US 9,851,473 B2
(45) Date of Patent: Dec. 26, 2017

(54) ANTI-REFLECTION FILM AND PRODUCTION METHOD THEREFOR

(71) Applicant: NITTO DENKO CORPORATION, Ibaraki-shi, Osaka (JP)

(72) Inventors: Atsushi Kishi, Ibaraki (JP); Tomonori Ueno, Ibaraki (JP); Hiroki Kuramoto, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/763,562

(22) PCT Filed: Jan. 27, 2014

(86) PCT No.: PCT/JP2014/051656
§ 371 (c)(1),
(2) Date: Jul. 27, 2015

(87) PCT Pub. No.: WO2014/119506
PCT Pub. Date: Aug. 7, 2014

(65) Prior Publication Data
US 2015/0355383 A1   Dec. 10, 2015

(30) Foreign Application Priority Data

Jan. 29, 2013   (JP) .................................. 2013-014457

(51) Int. Cl.
*G02B 1/116* (2015.01)
*C23C 14/34* (2006.01)
(Continued)

(52) U.S. Cl.
CPC ................ *G02B 1/116* (2013.01); *B32B 7/02* (2013.01); *B32B 27/06* (2013.01); *B32B 27/20* (2013.01);
(Continued)

(58) Field of Classification Search
CPC ..... G02B 1/116; G02B 1/111; G02B 27/0012; B32B 7/02; B32B 27/06; B32B 27/20; C23C 14/34
(Continued)

(56) References Cited

U.S. PATENT DOCUMENTS 3,432,225 A   3/1969   Rock
3,712,711 A   1/1973   Adachi
(Continued)

FOREIGN PATENT DOCUMENTS

CN   1575970 A     2/2005
EP   0 933 654 A2  8/1999
(Continued)

OTHER PUBLICATIONS

Office Action dated May 23, 2016, issued in counterpart Chinese Application No. 2014800064976, with English translation (24 pages).
(Continued)

*Primary Examiner* — Frank Font
(74) *Attorney, Agent, or Firm* — Westerman, Hattori, Daniels & Adrian, LLP

(57) ABSTRACT

There is provided an anti-reflection film that has an excellent reflection characteristic (low reflectivity) in a wide spectrum and has an excellent reflection hue that is close to neutral, and a method by which such anti-reflection film can be produced with high productivity and at a low cost. An anti-reflection film according to the present invention includes: a substrate; and a medium-refractive index layer, a high-refractive index layer, and a low-refractive index layer in the stated order from a substrate side. A refractive index $n_S$ of the substrate, a refractive index $n_M$ of the medium-refractive index layer, and a refractive index $n_H$ of the
(Continued)

high-refractive index layer satisfy the following expression (1):

$$\frac{n_H - 1}{n_H + 1} - \sqrt{1 - \frac{4n_M^2 n_S}{n_M^2(1+n_S)^2 - (1-n_M^2)(n_M^2 - n_S^2)}} \geq 0.02 \quad (1)$$

where the refractive index $n_S$ of the substrate, the refractive index $n_M$ of the medium-refractive index layer, and the refractive index $n_H$ of the high-refractive index layer have a relationship of $n_H > n_M > n_S$.

9 Claims, 3 Drawing Sheets

(51) Int. Cl.

| | | |
|---|---|---|
| B32B 7/02 | (2006.01) | |
| B32B 27/06 | (2006.01) | |
| B32B 27/20 | (2006.01) | |
| G02B 1/111 | (2015.01) | |
| G02B 27/00 | (2006.01) | |
| G02B 5/30 | (2006.01) | |
| C23C 14/08 | (2006.01) | |

(52) U.S. Cl.
CPC .......... *G02B 1/111* (2013.01); *G02B 27/0012* (2013.01); *B32B 2255/10* (2013.01); *B32B 2255/205* (2013.01); *B32B 2264/10* (2013.01); *B32B 2307/418* (2013.01); *B32B 2457/20* (2013.01); *C23C 14/08* (2013.01); *C23C 14/34* (2013.01); *G02B 5/30* (2013.01)

(58) Field of Classification Search
USPC .......................................... 359/492.01, 601
See application file for complete search history.

(56) References Cited

U.S. PATENT DOCUMENTS

| | | | |
|---|---|---|---|
| 6,074,730 | A | 6/2000 | Laird et al. |
| 6,207,263 | B1 | 3/2001 | Takematsu et al. |
| 6,589,657 | B2 | 7/2003 | Dannenberg |
| 6,950,236 | B2 | 9/2005 | Hokazono et al. |
| 7,332,213 | B2 | 2/2008 | Mimura et al. |
| 8,691,351 | B2 | 4/2014 | Asakura et al. |
| 2001/0021446 | A1 | 9/2001 | Takematsu et al. |
| 2003/0064255 | A1 | 4/2003 | Dannenberg |
| 2004/0114248 | A1 | 6/2004 | Hokazono et al. |
| 2005/0008863 | A1 | 1/2005 | Mimura et al. |
| 2008/0088925 | A1* | 4/2008 | Yoneyama ............... B32B 3/20 359/487.06 |
| 2008/0239488 | A1 | 10/2008 | Asakura et al. |
| 2011/0075261 | A1* | 3/2011 | Fukuda ................... C08J 7/047 359/580 |
| 2011/0183110 | A1* | 7/2011 | Yamazaki ................ G02B 1/04 428/141 |
| 2012/0177848 | A1* | 7/2012 | Kamohara ................ C08J 5/18 428/1.31 |

FOREIGN PATENT DOCUMENTS

| | | |
|---|---|---|
| JP | 1-131501 A | 5/1989 |
| JP | 10-206603 A | 8/1998 |
| JP | 11-271507 A | 10/1999 |
| JP | 2000-47004 A | 2/2000 |
| JP | 2004-47004 A | 2/2000 |
| JP | 2001-281415 A | 10/2001 |
| JP | 2002-243906 A | 8/2002 |
| JP | 2003-094548 A | 4/2003 |
| JP | 2003-121602 A | 4/2003 |
| JP | 2005-502077 A | 1/2005 |
| JP | 2005-62584 A | 3/2005 |
| JP | 2006-126799 A | 5/2006 |
| JP | 2008-262187 A | 10/2008 |
| JP | 2013-122516 A | 6/2013 |
| TW | 567338 B | 12/2003 |

OTHER PUBLICATIONS

Search Report dated Mar. 11, 2014, issued in counterpart International Application No. PCT/JP2014/051656 (2 pages).
International Search Report dated Mar. 11, 2014, issued in counterpart International Application No. PCT/JP2014/051656 (2 pages).
Office Action dated Feb. 14, 2017, issued in counterpart Taiwanese Application No. 103103679, with English tranlsation. (9 pages).
Office Action dated Feb. 15, 2017, issued in counterpart Taiwanese Application No. 103103674, with English translation. (11 pages).
Non-Final Office Action dated Sep. 15, 2017, issued in U.S. Appl. No. 14/763,583. (27 pages).
Office Action dated Oct. 4, 2017, issued in counterpart Japanese Application No. 2014-011689, with English translation (20 pages).
Office Action dated Nov. 8, 2017, issued in counterpart Japanese Application No. 2014-011690, with English ranslation (16 pages).

\* cited by examiner

ANTI-REFLECTION FILM AND PRODUCTION METHOD THEREFOR

TECHNICAL FIELD

The present invention relates to an anti-reflection film and a method of producing the film. More specifically, the present invention relates to a method of producing an anti-reflection film including a dry process and a wet process, and an anti-reflection film to be obtained by the production method.

BACKGROUND ART

An anti-reflection film to be placed on the surface of the display screen of, for example, a CRT, a liquid crystal display apparatus, or a plasma display panel has heretofore been widely used for preventing the reflection of ambient light on the display screen. As the anti-reflection film, there has been known, for example, a multilayer film having a layer formed of a medium-refractive index material, a layer formed of a high-refractive index material, and a layer formed of a low-refractive index material. It has been known that the use of such multilayer film can provide high anti-reflection performance (a low reflectance in a wide spectrum). Such multilayer film is generally formed by a dry process such as a vapor deposition method or a sputtering method. However, the dry process involves a problem in that the process is poor in productivity and hence leads to an increase in production cost.

To solve the problem, a multilayer anti-reflection film obtained by combining the dry process and a wet process such as coating or application has been proposed (for example, Patent Literature 1). However, the productivity and cost-reducing effect of each of technologies proposed heretofore including Patent Literature 1 are still insufficient, and the optical characteristics of anti-reflection films to be obtained by employing the technologies are also insufficient.

Incidentally, the anti-reflection performance of an anti-reflection film is generally evaluated in terms of a luminous reflectance Y (%), and as the luminous reflectance reduces, the anti-reflection performance becomes more excellent. However, when an attempt is made to reduce the luminous reflectance, there arises a problem in that the reflection hue of the film is liable to color.

As described above, a multilayer anti-reflection film that achieves compatibility between a low luminous reflectance and a reflection hue that colors to a small extent and is close to neutral, and a technology by which such film can be obtained with high productivity and at a low cost have been strongly desired.

CITATION LIST

Patent Literature

[PTL 1] JP 2002-243906 A

SUMMARY OF INVENTION

Technical Problem

The present invention has been made to solve the conventional problems, and an object of the present invention is to provide an anti-reflection film that has an excellent reflection characteristic (low reflectivity) in a wide spectrum and has an excellent reflection hue that is close to neutral, and a method by which such anti-reflection film can be produced with high productivity and at a low cost.

Solution to Problem

An anti-reflection film according to the present invention includes: a substrate; and a medium-refractive index layer, a high-refractive index layer, and a low-refractive index layer in the stated order from a substrate side. A refractive index $n_S$ of the substrate, a refractive index $n_M$ of the medium-refractive index layer, and a refractive index $n_H$ of the high-refractive index layer satisfy the following expression (1):

$$\frac{n_H - 1}{n_H + 1} - \sqrt{1 - \frac{4n_M^2 n_S}{n_M^2(1+n_S)^2 - (1-n_M^2)(n_M^2 - n_S^2)}} \geq 0.02 \quad (1)$$

where the refractive index $n_S$ of the substrate, the refractive index $n_M$ of the medium-refractive index layer, and the refractive index $n_H$ of the high-refractive index layer have a relationship of $n_H > n_M > n_S$.

In one embodiment of the present invention, the refractive index of the substrate falls within a range of from 1.45 to 1.65, the refractive index of the medium-refractive index layer falls within a range of from 1.67 to 1.78, and the refractive index of the high-refractive index layer falls within a range of from 2.00 to 2.60.

In one embodiment of the present invention, the high-refractive index layer has an optical thickness at a wavelength of 580 nm of $\lambda/8$ or less.

In one embodiment of the present invention, the high-refractive index layer is formed by sputtering a metal oxide or a metal nitride, or by sputtering a metal while introducing oxygen to oxidize the metal.

In one embodiment of the present invention, the medium-refractive index layer contains a binder resin and inorganic fine particles dispersed in the binder resin.

In one embodiment of the present invention, the medium-refractive index layer is formed by applying, onto the substrate, a composition for forming a medium-refractive index layer containing the binder resin and the inorganic fine particles, and curing the composition.

According to another aspect of the present invention, there is provided a method of producing an anti-reflection film. The method includes: applying, onto a substrate, a composition for forming a medium-refractive index layer containing a binder resin and inorganic fine particles, followed by curing of the composition to form a medium-refractive index layer; sputtering a metal oxide or a metal nitride onto the medium-refractive index layer, or sputtering a metal onto the medium-refractive index layer while introducing oxygen to oxidize the metal, to form a high-refractive index layer; and sputtering a metal oxide or a metal fluoride onto the high-refractive index layer to form a low-refractive index layer. A refractive index $n_S$ of the substrate, a refractive index $n_M$ of the medium-refractive index layer, and a refractive index $n_H$ of the high-refractive index layer satisfy the following expression (1):

$$\frac{n_H - 1}{n_H + 1} - \sqrt{1 - \frac{4n_M^2 n_S}{n_M^2(1+n_S)^2 - (1-n_M^2)(n_M^2 - n_S^2)}} \geq 0.02 \quad (1)$$

where the refractive index $n_S$ of the substrate, the refractive index $n_M$ of the medium-refractive index layer, and the refractive index $n_H$ of the high-refractive index layer have a relationship of $n_H>n_M>n_S$.

According to still another aspect of the present invention, there is provided a polarizing plate with an anti-reflection film. The polarizing plate with an anti-reflection film includes the anti-reflection film as described above.

According to still another aspect of the present invention, there is provided an image display apparatus. The apparatus includes the anti-reflection film as described above or the polarizing plate with an anti-reflection film as described above.

Advantageous Effects of Invention

According to the present invention, the medium-refractive index layer is formed by using a specific resin composition through a wet process (application and curing), and the refractive indices of the substrate, the medium-refractive index layer, and the high-refractive index layer are optimized so as to satisfy the expression (1). Thus, the anti-reflection film that has an excellent reflection characteristic (low reflectivity) in a wide spectrum and has an excellent reflection hue that is close to neutral can be obtained while the thickness of the high-refractive index layer is markedly reduced as compared with a conventional one. In addition, according to the present invention, the high-productivity and low-cost production method can be realized by employing the wet process and by virtue of the fact that the thickness of the high-refractive index layer can be reduced.

DESCRIPTION OF EMBODIMENTS

Figure 1:
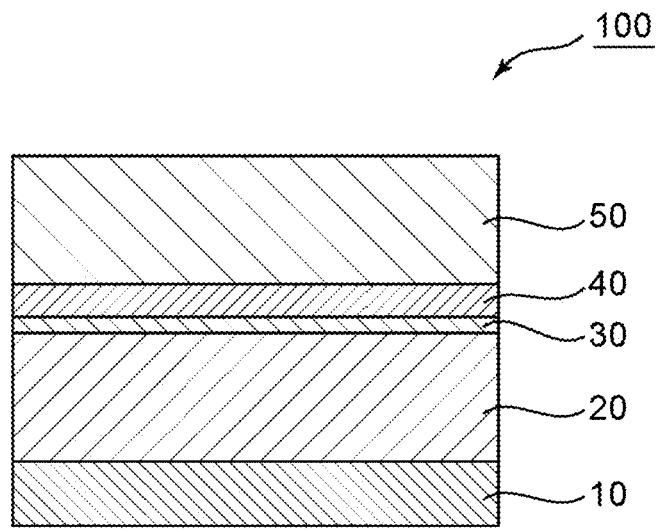
FIG. 1 is a schematic sectional view of an anti-reflection film according to one embodiment of the present invention.

Hereinafter, preferred embodiments of the present invention are described with reference to the drawings, but the present invention is not limited to these embodiments. It should be noted that the lengths, thicknesses, and the like of the respective layers and the like in the drawings are different from actual scales for ease of viewing.

A. Entire Construction of Anti-Reflection Film

FIG. 1 is a schematic sectional view of an anti-reflection film according to one embodiment of the present invention. An anti-reflection film 100 includes a substrate 10, and a medium-refractive index layer 20, an adhesion layer 30 to be arranged as required, a high-refractive index layer 40, and a low-refractive index layer 50 in the stated order from the substrate 10 side. In the present invention, a refractive index $n_S$ of the substrate, a refractive index $n_M$ of the medium-refractive index layer, and a refractive index $n_H$ of the high-refractive index layer satisfy the below-indicated expression (1). Here, the refractive index $n_S$ of the substrate, the refractive index $n_M$ of the medium-refractive index layer, and the refractive index $n_H$ of the high-refractive index layer have a relationship of $n_H>n_M>n_S$.

$$\frac{n_H-1}{n_H+1} - \sqrt{1 - \frac{4n_M^2 n_S}{n_M^2(1+n_S)^2 - (1-n_M^2)(n_M^2-n_S^2)}} \geq 0.02 \quad (1)$$

As long as such expression is satisfied, according to the anti-reflection film of this embodiment, excellent reflection performance (low reflectivity) can be realized in a wide spectrum while the thickness of the high-refractive index layer is markedly reduced as compared with a conventional one. The high-refractive index layer is typically formed by the sputtering of a metal oxide such as $Nb_2O_5$, but the rate of such sputtering is known to be extremely slow. Therefore, the production efficiency of the entirety of the anti-reflection film can be significantly improved by reducing the thickness of the high-refractive index layer. In addition, as long as such expression is satisfied, desired reflection performance can be secured even when the refractive index of the medium-refractive index layer is reduced. As a result, the medium-refractive index layer can be formed by a wet process (application and curing) involving using a resin-based material, and hence a production cost can be additionally curtailed and productivity can be additionally improved.

Figure 2:
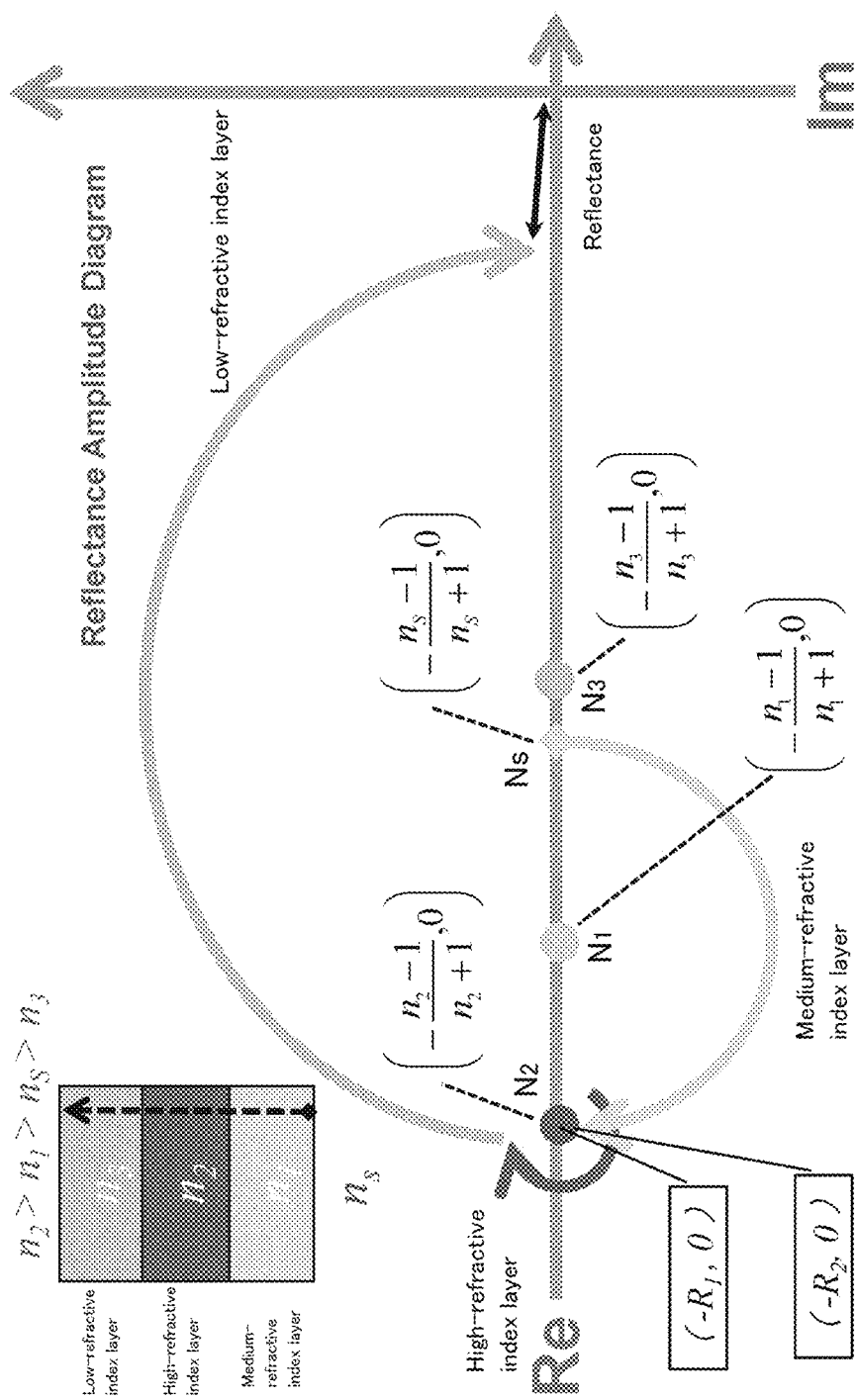
FIG. 2 is a reflectance amplitude diagram for illustrating the concept of the optical design of a wide-spectrum anti-reflection film (medium-refractive index layer/high-refractive index layer/low-refractive index layer).

In the expression (1), when $(n_H-1)/(n_H+1)$ on the left of the left side is represented by $R_1$ and the expression represented by a square root on the right of the left side is represented by $R_2$, $R_1$ means a reflectance intrinsic to the high-refractive index layer and $R_2$ means a reflectance when the medium-refractive index layer having an optical thickness of $\lambda/4$ is laminated on the substrate. Here, the optical design of a wide-spectrum anti-reflection film can be performed by using such a complex plane called a reflectance amplitude diagram as illustrated in FIG. 2. The reflectance amplitude diagram is obtained by calculating an amplitude reflectance when the layers of a laminate illustrated in FIG. 2 are continuously laminated in a direction from a substrate toward an air interface as indicated by an arrow, and plotting the amplitude reflectance on a complex plane, and enables visual grasping of the optical design of a multilayer anti-reflection film as described below. For example, the lamination locus and reflectance of the laminate having such a relationship among refractive indices as illustrated in FIG. 2 are determined as follows. (1) Specifically, four points, i.e., a point $N_S$ $\{-(n_S-1)/(n_S+1), 0\}$ of a substrate layer, a point $N_1$ $\{-(n_1-1)/(n_1+1), 0\}$ of a first layer (the medium-refractive index layer in the present invention), a point $N_2$ $\{-(n_2-1)/(n_2+1), 0\}$ of a second layer (the high-refractive index layer in the present invention), and a point $N_3$ $\{-(n_3-1)/(n_3+1), 0\}$ of a third layer (the low-refractive index layer in the present invention) are plotted. (2) A circle is drawn clockwise by using the point $N_S$ of the refractive index of the substrate layer as a starting point and the point $N_1$ of the refractive index of the first layer as a pivot. At this time, the size of an arc (the angle of the arc) corresponds to a thickness and an optical thickness of $\lambda/4$ corresponds to a semicircle. (3) Next, a circle is drawn clockwise by using the end of the first layer as a starting point and the point $N_2$ of the refractive index of the second layer as a pivot. (4) Similarly, a circle is drawn clockwise by using the end of the second layer as a starting point and the point $N_3$ of the refractive index of the third layer as a pivot. (5) A distance between the final point and coordinates (0, 0) corresponds to the reflectance. As the distance shortens, an anti-reflection film having a more excellent reflection characteristic (lower reflectivity) is obtained. Strictly speaking, the "pivot" in such design procedure is not the center of a circle, but for convenience, it is acceptable to perform the design by plotting points that can be easily calculated from the respective refractive indices (such as $N_S$, $N_1$, $N_2$, and $N_3$). It should be noted that a reflectance that can be actually measured is the square of a distance from (0, 0), but in the design, there is no harm in regarding the distance as the reflectance in a conceptual sense. The same holds true for $R_1$ and $R_2$ described in the foregoing. In addition, the lamination locus of the complex plane varies from wavelength to wavelength in a visible light region, but the design is generally performed at a wavelength of 580 nm at which luminous sensitivity is said to be highest. In addition, when the reflectance is maintained at a low level in a wide wavelength region mainly including 580 nm, a hue that colors to a small extent and is close to neutral is secured. FIG. 2 is an illustration of the lamination locus of a typical wide-spectrum anti-reflection film having a construction "medium-refractive index layer ($n_1$)/high-refractive index layer ($n_2$)/low-refractive index layer ($n_3$)" at 580 nm, and with regard to the roles of the respective layers, it is illustrated in the figure that the following functional classification can be performed: the medium-refractive index layer has a reflection-lowering function, the high-refractive index layer has a spectrum-widening function, and the low-refractive index layer is a low-reflection layer. Therefore, the inventors have found that when the constructions of the substrate, the medium-refractive index layer, and the low-refractive index layer are retained as they are in a construction "substrate/medium-refractive index layer/high-refractive index layer/low-refractive index layer," as is apparent from FIG. 3, as a distance between the pivot about which the second arc is drawn (the point of the refractive index intrinsic to the high-refractive index layer) and the point at which the first arc intersects the axis of abscissa enlarges, in such design that the thickness of the high-refractive index layer is small, lower reflection can be achieved while a wide spectrum is maintained. That is, even when the angle of the second arc is reduced, a layer having a spectrum-widening function is obtained. The point of the refractive index intrinsic to the high-refractive index layer corresponds to $R_1$ and the point at which the first arc intersects the axis of abscissa corresponds to $R_2$, and hence as a difference ($R_1$-$R_2$) enlarges, a desired reflectance can be obtained better while the thickness of the high-refractive index layer is reduced. Therefore, in the present invention, the difference ($R_1$-$R_2$) is preferably 0.02 or more, more preferably 0.03 or more. An upper limit for the difference ($R_1$-$R_2$) is, for example, 0.2. According to the present invention, through the use of such design concept, the thickness of the high-refractive index layer can be markedly reduced and the refractive index of the medium-refractive index layer can be set to a value that can be realized on a resin basis. As a result, the medium-refractive index layer is formed by the wet process (application and curing), and hence the production efficiency can be significantly improved and the production cost can be significantly suppressed. Moreover, excellent reflection performance can be realized. Such design concept is completely different from a conventional one. That is, when the design is performed on the premise that the difference ($R_1$-$R_2$) is nearly equal to zero as illustrated in FIG. 2, it has heretofore been necessary to set the optical thickness of each of the medium-refractive index layer, the high-refractive index layer, and the low-refractive index layer to about $\lambda/4$ in order that a desired reflection characteristic may be obtained. Therefore, even when the medium-refractive index layer is formed by the wet process in the design, the thickness of the high-refractive index layer needs to be set to about $\lambda/4$. On the other hand, the thickness of the high-refractive index layer can be made much smaller by the completely different design concept according to the present invention. It should be noted that in the description of the anti-reflection film of the present invention, the refractive indices of the medium-refractive index layer, the high-refractive index layer, and the low-refractive index layer are represented by $n_M$, $n_H$, and $n_L$, respectively unlike notations in the general description of FIG. 2. In addition, as described above, the refractive index $n_S$ of the substrate, the refractive index $n_M$ of the medium-refractive index layer, and the refractive index $n_H$ of the high-refractive index layer have a relationship of $n_H > n_M > n_S$.

The reflection hue of the anti-reflection film in the CIE-Lab colorimetric system is as follows: relationships of $0 \leq a^*\_15$ and $-20 \leq b^* \leq 0$ are preferably satisfied, and relationships of $0 \leq a^* \leq 10$ and $-15 \leq b^* \leq 0$ are more preferably satisfied. According to the present invention, the optimization of the refractive indices of the respective layers through the use of the expression (1) can provide an anti-reflection film having an excellent reflection hue that is close to neutral in addition to the above-mentioned effect.

The luminous reflectance Y of the anti-reflection film is preferably as low as possible, and is preferably 1.0% or less, more preferably 0.7% or less, still more preferably 0.5% or less. As described above, according to the present invention, compatibility between a low luminous reflectance (an excellent anti-reflection characteristic) and a reflection hue that colors to a small extent and is close to neutral (an excellent reflection hue) can be achieved in a multilayer anti-reflection film.

Hereinafter, each layer constituting the anti-reflection film is described in detail.

A-1. Substrate

The substrate 10 can be constituted of any appropriate resin film as long as the effects of the present invention are obtained. Specifically, the substrate 10 can be a resin film having transparency. Specific examples of the resin for forming the film include polyolefin-based resins (such as polyethylene and polypropylene), polyester-based resins (such as polyethylene terephthalate and polyethylene naphthalate), polyamide-based resins (such as nylon-6 and nylon-66), a polystyrene resin, a polyvinyl chloride resin, a polyimide resin, a polyvinyl alcohol resin, an ethylene vinyl alcohol resin, a (meth)acrylic resin, a (meth)acrylonitrile resin, and cellulose-based resins (such as triacetylcellulose, diacetylcellulose, and cellophane). The substrate may be a single layer, may be a laminate of a plurality of resin films, or may be a laminate of a resin film (a single layer or a laminate) and the following hard coat layer. The substrate (substantially a composition for forming the substrate) can contain any appropriate additive. Specific examples of the additive include an antistatic agent, a UV-absorbing agent, a plasticizer, a lubricant, a colorant, an antioxidant, and a flame retardant. It should be noted that detailed description of a material constituting the substrate is omitted because the material is well known in the art.

In one embodiment, the substrate 10 can function as a hard coat layer. That is, as described above, the substrate 10 may be a laminate of a resin film (a single layer or a laminate) and a hard coat layer to be described below. Alternatively, the hard coat layer may constitute the substrate alone. When the substrate is constituted of the laminate of the resin film and the hard coat layer, the hard coat layer can be placed so as to be adjacent to the medium-refractive index layer 20. The hard coat layer is a cured layer of any appropriate ionizing radiation-curable resin. Examples of an ionizing radiation include UV light, visible light, an infrared ray, and an electron beam. Of those, UV light is preferred. Therefore, the ionizing radiation-curable resin is preferably a UV-curable resin. Examples of the UV-curable resin include a (meth)acrylic resin, a silicone-based resin, a polyester-based resin, a urethane-based resin, an amide-based resin, and an epoxy-based resin. A typical example of the (meth)acrylic resin is a cured product (polymerized product) obtained by curing a (meth)acryloyloxy group-containing polyfunctional monomer with a UV light. The polyfunctional monomers may be used alone or in combination. Any appropriate photopolymerization initiator can be added to the polyfunctional monomer. It should be noted that detailed description of a material constituting the hard coat layer is omitted because the material is well known in the art.

Any appropriate inorganic or organic fine particles can be dispersed in the hard coat layer. The particle diameter of each of the fine particles is, for example, from 0.01 μm to 3 μm. Alternatively, an uneven shape can be formed on the surface of the hard coat layer. The adoption of such construction can impart a light-diffusing function generally referred to as "antiglare". Silicon oxide ($SiO_2$) can be suitably used as the fine particles to be dispersed in the hard coat layer from the viewpoints of, for example, a refractive index, stability, and heat resistance. Further, the hard coat layer (substantially a composition for forming the hard coat layer) can contain any appropriate additive. Specific examples of the additive include a leveling agent, a filler, a dispersant, a plasticizer, a UV-absorbing agent, a surfactant, an antioxidant, and a thixotropic agent.

The hard coat layer has a hardness of preferably H or more, more preferably 3H or more in a pencil hardness test. The measurement of the pencil hardness test may be performed in conformity with JIS K 5400.

The thickness of the substrate 10 can be appropriately set depending on, for example, a purpose and the construction of the substrate. When the substrate is constituted as a single layer of a resin film or a laminate of resin films, the thickness is, for example, from 10 μm to 200 μm. When the substrate includes a hard coat layer or when the substrate is constituted of the hard coat layer alone, the thickness of the hard coat layer is, for example, from 1 μm to 50 μm.

The refractive index of the substrate 10 (when the substrate has a laminated structure, the refractive index of a layer adjacent to the medium-refractive index layer) is preferably from 1.45 to 1.65, more preferably from 1.50 to 1.60. Such refractive index can increase a degree of freedom in design of the medium-refractive index layer for satisfying the expression (1). It should be noted that the term "refractive index" as used herein refers to a refractive index measured at a temperature of 25° C. and a wavelength λ of 580 nm on the basis of JIS K 7105 unless otherwise stated.

A-2. Medium-Refractive Index Layer

The medium-refractive index layer 20 typically contains a binder resin and inorganic fine particles dispersed in the binder resin. The binder resin is typically an ionizing radiation-curable resin, more specifically a UV-curable resin. Examples of the UV-curable resin include radical-polymerizable monomers and oligomers such as a (meth)acrylate resin (epoxy(meth)acrylate, polyester(meth)acrylate, acrylic (meth)acrylate, or ether(meth)acrylate). A monomer component (precursor) that constructs the acrylate resin preferably has a molecular weight of from 200 to 700. Specific examples of the monomer component (precursor) that constructs the (meth)acrylate resin include pentaerythritol triacrylate (PETA, molecular weight: 298), neopentylglycol diacrylate (NPGDA, molecular weight: 212), dipentaerythritol hexaacrylate (DPHA, molecular weight: 632), dipentaerythritol pentaacrylate (DPPA, molecular weight: 578), and trimethylolpropane triacrylate (TMPTA, molecular weight: 296). If required, an initiator may be added. Examples of the initiator include a UV radical generator (e.g., Irgacure 907, 127, or 192 manufactured by Ciba Specialty Chemicals) and benzoyl peroxide. The binder resin may contain another resin component other than the above-mentioned ionizing radiation-curable resin. The another resin component may be an ionizing radiation-curable resin, a thermosetting resin, or a thermoplastic resin. Typical examples of the another resin component include an aliphatic (for example, polyolefin) resin and a urethane-based resin. In the case of using the another resin component, the kind and blending amount thereof are adjusted so that the refractive index of the medium-refractive index layer to be obtained satisfies the relationship of the above-mentioned expression (1).

The refractive index of the binder resin is preferably from 1.40 to 1.60.

The blending amount of the binder resin is preferably from 10 parts by weight to 80 parts by weight, more preferably from 20 parts by weight to 70 parts by weight with respect to 100 parts by weight of the medium-refractive index layer to be formed.

The inorganic fine particles may be constituted of, for example, a metal oxide. Specific examples of the metal oxide include zirconium oxide (zirconia) (refractive index: 2.19), aluminum oxide (refractive index: 1.56 to 2.62), titanium oxide (refractive index: 2.49 to 2.74), and silicon oxide (refractive index: 1.25 to 1.46). Each of those metal oxides absorbs a small quantity of light and has a refractive index that is hardly expressed by an organic compound such as an ionizing radiation-curable resin or a thermoplastic resin. Accordingly, the refractive index of the medium-refractive index layer can be easily adjusted, and as a result, a medium-refractive index layer having such a refractive index as to satisfy the expression (1) can be formed by coating. Particularly preferred inorganic compounds are zirconium oxide and titanium oxide. This is because each of zirconium oxide and titanium oxide has an appropriate refractive index and appropriate dispersibility in the binder resin, and hence can form a medium-refractive index layer having a desired refractive index and a desired dispersed structure.

The refractive index of the inorganic fine particles is preferably 1.60 or more, more preferably from 1.70 to 2.80, particularly preferably from 2.00 to 2.80. When the refractive index falls within such range, a medium-refractive index layer having a desired refractive index can be formed.

The average particle diameter of the inorganic fine particles is preferably from 1 nm to 100 nm, more preferably from 10 nm to 80 nm, still more preferably from 20 nm to 70 nm. As described above, by using the inorganic fine particles with an average particle diameter smaller than the wavelength of light, geometric reflection, refraction, and scattering are not caused between the inorganic fine particles and the binder resin, and a medium-refractive index layer that is optically uniform can be obtained.

It is preferred that the inorganic fine particles has satisfactory dispersibility with the binder resin. The term "satisfactory dispersibility" as used herein means that a coating film, which is obtained by applying an application liquid obtained by mixing the binder resin, the inorganic fine particles (if required, a small amount of a UV initiator), and a volatile solvent, followed by removing the solvent by drying, is transparent.

In one embodiment, the inorganic fine particles are subjected to surface modification. By conducting surface modification, the inorganic fine particles can be dispersed satisfactorily in the binder resin. As surface modification means, any suitable means can be adopted as long as the effect of the present invention is obtained. Typically, the surface modification is conducted by applying a surface modifier onto the surface of each of the inorganic fine particles to form a surface modifier layer. Specific examples of the preferred surface modifier include coupling agents such as a silane-based coupling agent and a titanate-based coupling agent, and a surfactant such as a fatty acid-based surfactant. By using such surface modifier, the wettability between the binder resin and the inorganic fine particles can be enhanced, the interface between the binder resin and the inorganic fine particles can be stabilized, and the inorganic fine particles can be dispersed satisfactorily in the binder resin. In another embodiment, the inorganic fine particles can be used without being subjected to any surface modification.

The blending amount of the inorganic fine particles is preferably from 10 parts by weight to 90 parts by weight, more preferably from 20 parts by weight to 80 parts by weight with respect to 100 parts by weight of the medium-refractive index layer to be formed. When the blending amount of the inorganic fine particles is excessively large, the mechanical characteristics of an anti-reflection film to be obtained become insufficient in some cases. In addition, in terms of optical design, the thickness of the high-refractive index layer needs to be increased and hence the productivity of the anti-reflection film becomes insufficient in many cases. When the blending amount is excessively small, a desired luminous reflectance is not obtained in some cases.

The thickness of the medium-refractive index layer 20 is preferably from 70 nm to 120 nm, more preferably from 80 nm to 115 nm. Such thickness can realize a desired optical thickness.

The refractive index of the medium-refractive index layer 20 is preferably from 1.67 to 1.78, more preferably from 1.70 to 1.78. When an attempt is made to realize low reflectivity in a wide spectrum in a conventional anti-reflection film, in the case where the refractive index of the low-refractive index layer is 1.47 and the refractive index of the high-refractive index layer is 2.33, the refractive index of the medium-refractive index layer has needed to be set to around 1.9. However, according to the present invention, even such low refractive index can realize desired optical characteristics. As a result, the medium-refractive index layer can be formed by the application and curing of a resin-based composition whose refractive index cannot be increased to a very large extent from the viewpoint of a mechanical characteristic (hardness), which can largely contribute to an improvement in productivity and a cost reduction.

Figure 3:
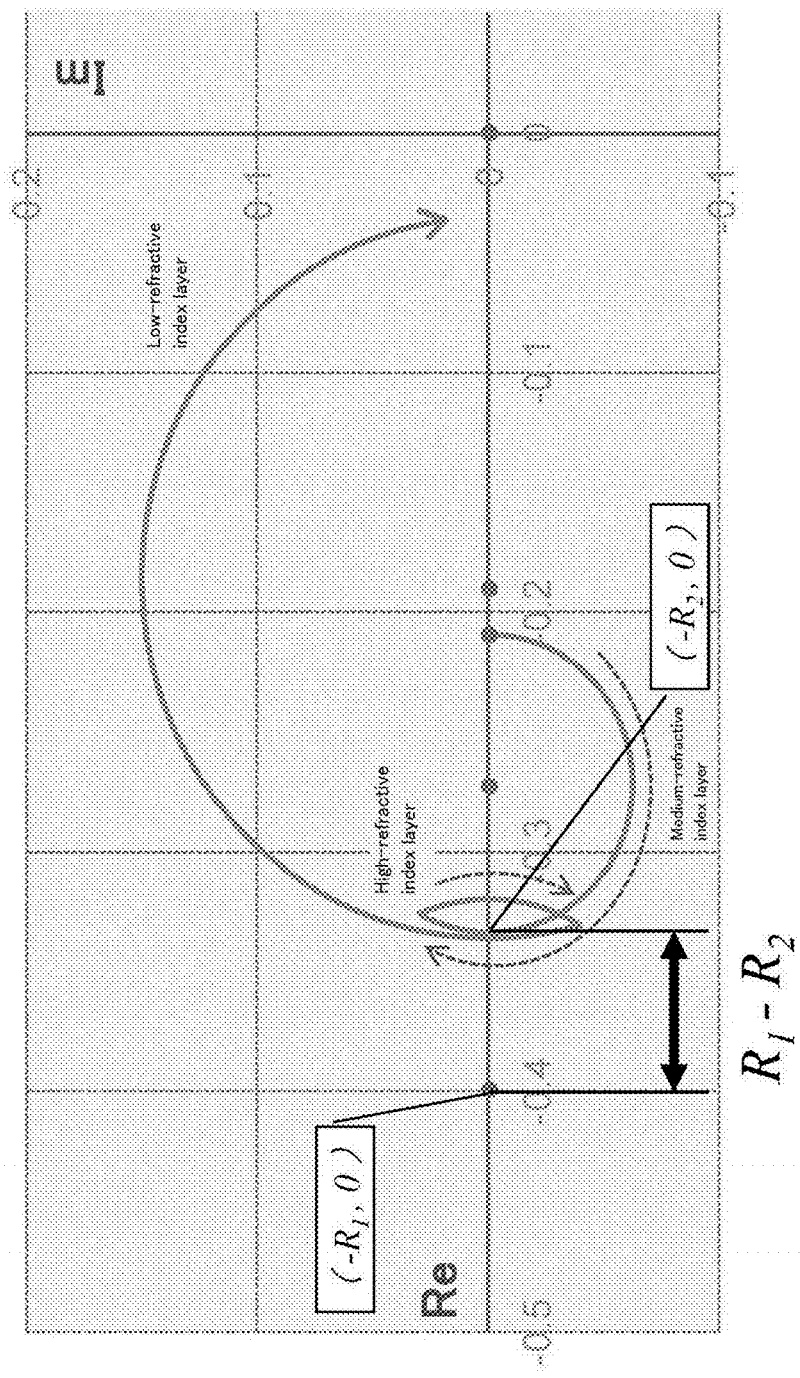
FIG. 3 is a reflectance amplitude diagram for illustrating the technical meaning of each of $R_1$ and $R_2$ in the expression (1) in actual design of an anti-reflection film based on the concept of FIG. 2.

The optical thickness of the medium-refractive index layer 20 at a wavelength of 580 nm is about $\lambda/4$ in order that the medium-refractive index layer may have a reflection-lowering function as described above. In one embodiment, the optical thickness is preferably $\lambda/4+\alpha$ ($0<\alpha<\lambda/16$). The basic idea is that as illustrated in FIG. 3, the optical thickness of the medium-refractive index layer is designed so as to be larger than $\lambda/4$ by $\alpha$, and is returned to the vicinity of a position of interest on the axis of abscissa (real axis) by the adjacent high-refractive index layer. Needless to say, however, design guidelines on the optical thickness are not limited to the idea. It should be noted that the optical thickness is the product of a refractive index n and a thickness d, and is represented as a ratio with respect to a wavelength of interest (here, 580 nm).

A-3. Adhesion Layer

The adhesion layer 30 is an optional layer that can be arranged for improving adhesiveness between the medium-refractive index layer 20 and the high-refractive index layer 40. The adhesion layer can be constituted of, for example, silicon. The thickness of the adhesion layer is, for example, from 2 nm to 5 nm.

A-4. High-Refractive Index Layer

When the high-refractive index layer 40 is used in combination with the low-refractive index layer 50, the anti-reflection film can efficiently prevent the reflection of light by virtue of a difference between their respective refractive indices. The high-refractive index layer 40 can be preferably placed so as to be adjacent to the low-refractive index layer 50. Further, the high-refractive index layer 40 can be preferably placed on the substrate side of the low-refractive index layer 50. Such construction can prevent the reflection of light in an extremely efficient manner.

The thickness of the high-refractive index layer 40 is preferably from 10 nm to 25 nm, more preferably from 10 nm to 20 nm, still more preferably from 12 nm to 18 nm. According to the present invention, the thickness of the high-refractive index layer can be markedly reduced as compared with the conventional one by forming such a specific medium-refractive index layer as described in the section A-2. As a result, an anti-reflection film having desired reflection performance can be obtained with high productivity and at a low cost.

The refractive index of the high-refractive index layer 40 is preferably from 2.00 to 2.60, more preferably from 2.10 to 2.45. With such refractive index, a desired refractive index difference between the high-refractive index layer and the low-refractive index layer can be secured, and hence the reflection of light can be efficiently prevented.

The optical thickness of the high-refractive index layer 40 at a wavelength of 580 nm is preferably $\lambda/8$ or less, more preferably approximately from $\lambda/32$ to $\lambda/8$. As described above, according to the present invention, the thickness of the high-refractive index layer can be markedly reduced as compared with the conventional one, and as a result, its optical thickness can also be markedly reduced. In addition, even such small optical thickness can secure desired reflection performance.

Any appropriate material can be used as a material constituting the high-refractive index layer 40 as long as the desired characteristics are obtained. Typical examples of such material include a metal oxide and a metal nitride. Specific examples of the metal oxide include titanium oxide ($TiO_2$), indium/tin oxide (ITO), niobium oxide ($Nb_2O_5$), yttrium oxide ($Y_2O_3$), indium oxide ($In_2O_3$), tin oxide ($SnO_2$), zirconium oxide ($ZrO_2$), hafnium oxide ($HfO_2$), antimony oxide ($Sb_2O_3$), tantalum oxide ($Ta_2O_5$), zinc oxide (ZnO), and tungsten oxide ($WO_3$). A specific example of the metal nitride is silicon nitride ($Si_3N_4$). Of those, niobium oxide ($Nb_2O_5$) or titanium oxide ($TiO_2$) is preferred. This is because $Nb_2O_5$ or $TiO_2$ has an appropriate refractive index and a low sputtering rate, and thus, the thinner film formation effect of the present invention becomes significant.

A-5. Low-Refractive Index Layer

As described above, when the low-refractive index layer 50 is used in combination with the high-refractive index layer 40, the anti-reflection film can efficiently prevent the reflection of light by virtue of the difference between their respective refractive indices. The low-refractive index layer 50 can be preferably placed so as to be adjacent to the high-refractive index layer 40. Further, the low-refractive index layer 50 can be preferably placed on the side of the high-refractive index layer 40 opposite to the substrate. Such construction can prevent the reflection of light in an extremely efficient manner.

The thickness of the low-refractive index layer 50 is preferably from 70 nm to 120 nm, more preferably from 80 nm to 115 nm. Such thickness can realize a desired optical thickness.

The refractive index of the low-refractive index layer 50 is preferably from 1.35 to 1.55, more preferably from 1.40 to 1.50. With such refractive index, a desired refractive index difference between the low-refractive index layer and the high-refractive index layer can be secured, and hence the reflection of light can be efficiently prevented.

The optical thickness of the low-refractive index layer 50 at a wavelength of 580 nm is about $\lambda/4$ because the layer corresponds to a general low-reflection layer.

Any appropriate material can be used as a material constituting the low-refractive index layer 50 as long as the desired characteristics are obtained. Typical examples of such material include a metal oxide and a metal fluoride. A specific example of the metal oxide is silicon oxide ($SiO_2$). Specific examples of the metal fluoride include magnesium fluoride and silicon oxide fluoride. Magnesium fluoride or silicon oxide fluoride is preferred from the viewpoint of its refractive index, silicon oxide is preferred from the viewpoints of ease of production, mechanical strength, moisture resistance, and the like, and silicon oxide is preferred in total consideration of various characteristics.

B. Method of Producing Anti-Reflection Film

Hereinafter, an example of a method of producing an anti-reflection film of the present invention is described.

B-1. Preparation of Substrate

First, the substrate 10 is prepared. A resin film formed of a composition containing such resin as described in the section A-1 may be used as the substrate 10, or a commercially available resin film may be used. Any appropriate method can be adopted as a method of forming the resin film. Specific examples thereof include extrusion and a solution casting method. When a laminate of resin films is used as the substrate, the substrate can be formed by, for example, co-extrusion.

When the substrate includes a hard coat layer, the hard coat layer is formed on, for example, the resin film. Any appropriate method can be adopted as a method of forming the hard coat layer on the substrate. Specific examples thereof include: application methods such as roll coating, die coating, air knife coating, blade coating, spin coating, reverse coating, and gravure coating; and printing methods such as gravure printing, screen printing, offset printing, and ink jet printing. When the substrate is constituted of the hard coat layer alone, it is appropriate to peel the resin film from the formed laminate of the resin film/the hard coat layer.

B-2. Formation of Medium-Refractive Index Layer

Next, the medium-refractive index layer 20 is formed on the substrate 10 prepared as described in the section B-1. More specifically, a composition for forming a medium-refractive index layer containing such binder resin and inorganic fine particles as described in the section A-2 (application liquid) is applied onto the substrate. A solvent can be used for improving the applicability of the application liquid. Any appropriate solvent in which the binder resin and the inorganic fine particles can be satisfactorily dispersed can be used as the solvent. Any appropriate method can be adopted as a method for the application. Specific examples of the application method include such methods as described in the section B-1. Next, the applied composition for forming a medium-refractive index layer is cured. When such binder resin as described in the section A-2 is used, the curing is performed by irradiation with an ionizing radiation. When UV light is used as the ionizing radiation, its cumulative light quantity is preferably from 200 mJ to 400 mJ. A heat treatment may be performed before and/or after the irradiation with the ionizing radiation as required. A heating temperature and a heating time can be appropriately set depending on a purpose and the like. As described above, in the production method of the present invention, the medium-refractive index layer 20 is formed by the wet process (application and curing).

B-3. Formation of Adhesion Layer

Next, the adhesion layer 30 is formed on the medium-refractive index layer 20 formed as described in the section B-2 as required. The adhesion layer 30 is typically formed by a dry process. Specific examples of the dry process include a physical vapor deposition (PVD) method and a chemical vapor deposition (CVD) method. Examples of the PVD method include a vacuum deposition method, a reactive deposition method, an ion beam assisted method, a sputtering method, and an ion plating method. An example of the CVD method is a plasma CVD method. Of those, a sputtering method may suitably be used when an in-line treatment is performed. The adhesion layer 30 is formed by, for example, sputtering with silicon. It should be noted that as described above, the adhesion layer is formed as required, and may be omitted.

B-4. Formation of High-Refractive Index Layer

Next, the high-refractive index layer 40 is formed on the medium-refractive index layer 20, or when the adhesion layer 30 is formed, the layer is formed on the adhesion layer. The high-refractive index layer 40 is typically formed by the dry process. In one embodiment, the high-refractive index layer 40 is formed by the sputtering of a metal oxide (such as $Nb_2O_5$) or a metal nitride. In another embodiment, the high-refractive index layer 40 is formed by sputtering a metal while introducing oxygen to oxidize the metal. In the present invention, thickness control is important because the thickness of the high-refractive index layer is extremely small, but such thickness control can be realized by appropriate sputtering.

B-5. Formation of Low-Refractive Index Layer

Finally, the low-refractive index layer 50 is formed on the high-refractive index layer 40 formed as described in the section B-4. In one embodiment, the low-refractive index layer 50 is formed by the dry process, and is formed by, for example, the sputtering of a metal oxide (such as $SiO_2$). In another embodiment, the low-refractive index layer 50 is formed by the wet process, and is formed by, for example, the application of a low-refractive index material using polysiloxane as a main component. In addition, the low-refractive index layer may be formed by: performing sputtering until part of a desired thickness is achieved; and then performing application until the remainder is achieved.

An antifouling layer may be arranged as a film that is so thin as not to impair the optical characteristics of the anti-reflection film (from about 1 nm to 10 nm) on the low-refractive index layer as required. The antifouling layer may be formed by the dry process or may be formed by the wet process depending on a formation material therefor.

Thus, the anti-reflection film can be produced.

According to the production method of the present invention, the number of layers to be formed by the dry process is substantially at most two, i.e., the high-refractive index layer and the low-refractive index layer (total thickness of the two layers: about 120 nm). Accordingly, the reflection hue of the anti-reflection film can be controlled in a markedly easy manner as compared with a conventional production method. For example, when design corresponding to the construction of the anti-reflection film of the present invention (medium-refractive index layer/high-refractive index layer/low-refractive index layer) is completed by the dry process, the high-refractive index layer and the low-refractive index layer can be used as components instead of the medium-refractive index layer to provide a construction "high-refractive index layer/low-refractive index layer/high-refractive index layer/low-refractive index layer." In such construction, however, four layers (total thickness of the four layers: about 200 nm) are to be formed by the dry process. According to the design to be completed by the dry process, the reflection hue largely fluctuates every time one layer is formed and every time the thickness of the layer slightly fluctuates. Accordingly, the thickness of each layer needs to be precisely controlled. In addition, the reflection hue complicatedly changes and hence in-line thickness control involves difficulty. Therefore, when the number of layers to be formed by the dry process is reduced, a burden for the thickness control is markedly alleviated and hence the control of the reflection hue becomes markedly easy.

C. Applications of Anti-Reflection Film

The anti-reflection film of the present invention can be suitably utilized for preventing the reflection of ambient light in an image display apparatus such as a CRT, a liquid crystal display apparatus, or a plasma display panel. The anti-reflection film of the present invention may be used as a single optical member or may be provided as a member integrated with any other optical member. For example, the film may be provided as a polarizing plate with an anti-reflection film by being bonded to a polarizing plate. Such polarizing plate with an anti-reflection film can be suitably used as, for example, a viewer-side polarizing plate of a liquid crystal display apparatus.

EXAMPLES

The present invention is specifically described below by way of Examples, but the present invention is not limited to Examples. Testing and evaluating methods in Examples are as described below. Moreover, unless otherwise specified, "%" in Examples is a weight-based unit.

<Evaluations for Optical Characteristics>

In order for a back-surface reflectance to be cut off, a measurement sample was produced by bonding an obtained anti-reflection film to a black acrylic plate (manufactured by Mitsubishi Rayon Co., Ltd., thickness: 2.0 mm) through a pressure-sensitive adhesive. The reflectance of such measurement sample by 5° regular reflection in a visible light region was measured with a spectrophotometer U4100 (manufactured by Hitachi High-Technologies Corporation). A luminous reflectance (Y) and a hue in the L*a*b* colorimetric system in a two-degree field of view under a C light source were calculated and determined from the spectrum of the resultant reflectance.

Example 1

A triacetylcellulose (TAC) film with a hard coat (refractive index: 1.53) was used as a substrate. Meanwhile, an application liquid (composition for forming a medium-refractive index layer) was prepared by diluting a resin composition (manufactured by JSR Corporation, trade name: "OPSTAR KZ Series") containing zirconia particles (average particle diameter: 40 nm, refractive index: 2.19) at a content of about 70% with respect to its total solid content with MIBK so that the content of the composition became 3%. The application liquid was applied onto the substrate with a bar coater, and was dried at 60° C. for 1 minute. After that, the dried product was irradiated with UV light having a cumulative light quantity of 300 mJ to form a medium-refractive index layer (refractive index: 1.75, thickness: 100 nm). Next, a high-refractive index layer (refractive index: 2.33, thickness: 18 nm) was formed on the medium-refractive index layer by sputtering $Nb_2O_5$. Further, a low-refractive index layer (refractive index: 1.47, thickness: 107 nm) was formed on the high-refractive index layer by sputtering $SiO_2$. Thus, an anti-reflection film was produced. The difference ($R_1$-$R_2$) in the resultant anti-reflection film was 0.066 and hence satisfied the expression (1). The resultant anti-reflection film was subjected to the evaluations for optical characteristics. The results are shown in Table 1.

Examples 2 to 11 and Comparative Examples 1 to 8

Anti-reflection films were produced according to constructions shown in Table 1. The resultant anti-reflection films were subjected to the evaluations for optical characteristics. The results are shown in Table 1.

It should be noted that in each of Examples and Comparative Examples, with regard to the substrate, a TAC film with a hard coat layer and a polyethylene terephthalate (PET) film with no hard coat layer were used as substrates having substrate refractive indices of 1.53 and 1.65, respectively. In the range of from 1.65 to 1.75, the refractive index of the medium-refractive index layer was changed by changing the content of the zirconia particles in the application liquid. In the range of from 1.77 to 1.90, the refractive index was changed by: using a resin composition (manufactured by Toyo Ink Co., Ltd., trade name: "LIODURAS TYT Series") containing titanium oxide particles; and changing the content of the titanium oxide particles in the application liquid. The refractive index of the high-refractive index layer was changed by sputtering ITO (refractive index: 2.10) or $TiO_2$ (refractive index: 2.50) instead of $Nb_2O_5$. The refractive indices of all low-refractive index layers were kept at a constant value by using $SiO_2$. In addition, the thickness of the medium-refractive index layer was changed by changing the application thickness of the application liquid. The thickness of any other layer was changed by changing a sputtering thickness.

It should be noted that Comparative Examples 7 and 8 are constructions corresponding to an anti-reflection film described in JP 2002-243906 A.

TABLE 1

| | Substrate | Medium-refractive index layer | | High-refractive index layer | | Low-refractive index layer | | | Reflectance Y | Reflection hue | |
|---|---|---|---|---|---|---|---|---|---|---|---|
| | $n_S$ | $n_M$ | $d_M$ | $n_H$ | $d_H$ | $n_L$ | $d_L$ | $R_1$-$R_2$ | (%) | a* | b* |
| Example 1 | 1.53 | 1.75 | 100 | 2.33 | 18 | 1.47 | 107 | 0.066 | 0.29 | 3.63 | −8.19 |
| Example 2 | 1.53 | 1.73 | 100 | 2.33 | 17 | 1.47 | 107 | 0.076 | 0.31 | 4.55 | −7.80 |
| Example 3 | 1.53 | 1.70 | 105 | 2.33 | 15 | 1.47 | 110 | 0.092 | 0.45 | 4.21 | −8.23 |
| Example 4 | 1.53 | 1.68 | 107 | 2.33 | 13 | 1.47 | 110 | 0.102 | 0.60 | 3.08 | −5.75 |
| Example 5 | 1.53 | 1.65 | 110 | 2.33 | 12 | 1.47 | 113 | 0.119 | 0.70 | 5.01 | −7.52 |
| Example 6 | 1.53 | 1.80 | 100 | 2.33 | 21 | 1.47 | 105 | 0.041 | 0.24 | 2.92 | −6.51 |
| Comparative Example 1 | 1.53 | 1.85 | 88 | 2.33 | 25 | 1.47 | 102 | 0.017 | 0.17 | 4.22 | −9.15 |
| Comparative Example 2 | 1.53 | 1.85 | 94 | 2.33 | 25 | 1.47 | 103 | 0.017 | 0.16 | 3.92 | −8.64 |
| Comparative Example 3 | 1.53 | 1.90 | 80 | 2.33 | 28 | 1.47 | 99 | −0.005 | 0.27 | 5.12 | −8.47 |
| Example 7 | 1.53 | 1.75 | 98 | 2.50 | 13 | 1.47 | 107 | 0.095 | 0.28 | 4.04 | −8.47 |
| Example 8 | 1.53 | 1.80 | 97 | 2.50 | 16 | 1.47 | 106 | 0.070 | 0.18 | 4.09 | −8.08 |
| Example 9 | 1.53 | 1.90 | 90 | 2.50 | 20 | 1.47 | 104 | 0.024 | 0.21 | 2.91 | −8.62 |
| Comparative Example 4 | 1.53 | 1.80 | 90 | 2.10 | 37 | 1.47 | 100 | −0.004 | 0.28 | 2.02 | −7.11 |
| Comparative Example 5 | 1.53 | 1.90 | 57 | 2.10 | 60 | 1.47 | 87 | −0.050 | 0.30 | 3.15 | −7.56 |
| Comparative Example 6 | 1.53 | 1.85 | 55 | 2.10 | 70 | 1.47 | 87 | −0.027 | 0.24 | 3.73 | −7.25 |
| Example 10 | 1.53 | 1.70 | 95 | 2.10 | 23 | 1.47 | 104 | 0.047 | 0.43 | 4.75 | −8.20 |
| Example 11 | 1.65 | 1.75 | 110 | 2.33 | 10 | 1.47 | 105 | 0.100 | 0.72 | 3.50 | −4.28 |
| Comparative Example 7 | 1.53 | 1.77 | 93 | 2.10 | 33 | 1.47 | 100 | 0.011 | 0.19 | 4.03 | −4.58 |
| Comparative Example 8 | 1.53 | 1.77 | 93 | 2.10 | 17 | 1.47 | 100 | 0.011 | 0.46 | 0.90 | −15.31 |

<Evaluation>

As is apparent from Table 1, according to each of Examples of the present invention, when the difference ($R_1$-$R_2$) was optimized to satisfy the expression (1), an anti-reflection film having excellent reflection performance (low reflectivity) was able to be obtained while the thickness of the high-refractive index layer was markedly reduced as compared with the conventional one. On the other hand, in the case of each of the anti-reflection films of Comparative Examples where the difference ($R_1$-$R_2$) did not satisfy the expression (1), when an attempt was made to secure a practically acceptable reflectance, the thickness of the high-refractive index layer needed to be increased. Further, when the difference ($R_1$-$R_2$) did not satisfy the expression (1), a reduction in thickness of the high-refractive index layer made the reflection hue unacceptable.

INDUSTRIAL APPLICABILITY

The anti-reflection film of the present invention can be suitably utilized for preventing the reflection of ambient light in an image display apparatus such as a CRT, a liquid crystal display apparatus, or a plasma display panel.

REFERENCE SIGNS LIST 10 substrate
20 medium-reflective index layer
30 adhesion layer
40 high-reflective index layer
50 low-reflective index layer
100 anti-reflection film

The invention claimed is:
1. An anti-reflection film, comprising:
a substrate; and
a medium-refractive index layer, a high-refractive index layer, and a low-refractive index layer in the stated order from a substrate side,
wherein a refractive index $n_S$ of the substrate, a refractive index $n_M$ of the medium-refractive index layer, and a refractive index $n_H$ of the high-refractive index layer satisfy the following expression (1):

$$\frac{n_H - 1}{n_H + 1} - \sqrt{1 - \frac{4 n_M^2 n_S}{n_M^2 (1 + n_S)^2 - (1 - n_M^2)(n_M^2 - n_S^2)}} \geq 0.02 \quad (1)$$

where the refractive index $n_S$ of the substrate, the refractive index $n_M$ of the medium-refractive index layer, and the refractive index $n_H$ of the high-refractive index layer have a relationship of $n_H > n_M > n_S$, and
wherein the high-refractive index layer is formed by sputtering a metal oxide or a metal nitride, or by sputtering a metal while introducing oxygen to oxidize the metal.

2. The anti-reflection film according to claim 1, wherein the refractive index of the substrate falls within a range of from 1.45 to 1.65, the refractive index of the medium-refractive index layer falls within a range of from 1.67 to 1.78, and the refractive index of the high-refractive index layer falls within a range of from 2.00 to 2.60.

3. The anti-reflection film according to claim 1, wherein the high-refractive index layer has an optical thickness at a wavelength of 580 nm of λ/8 or less.

4. The anti-reflection film according to claim 1, wherein the medium-refractive index layer contains a binder resin and inorganic fine particles dispersed in the binder resin.

5. The anti-reflection film according to claim 4, wherein the medium-refractive index layer is formed by applying, onto the substrate, a composition for forming the medium-refractive index layer containing the binder resin and the inorganic fine particles, and curing the composition.

6. A polarizing plate with an anti-reflection film, comprising the anti-reflection film of claim 1.

7. An image display apparatus, comprising the polarizing plate with an anti-reflection film of claim 6.

8. An image display apparatus, comprising the anti-reflection film of claim 1.

9. A method of producing an anti-reflection film, comprising:

applying, onto a substrate, a composition for forming a medium-refractive index layer containing a binder resin and inorganic fine particles, followed by curing of the composition to form a medium-refractive index layer;

sputtering a metal oxide or a metal nitride onto the medium-refractive index layer, or sputtering a metal onto the medium-refractive index layer while introducing oxygen to oxidize the metal, to form a high-refractive index layer; and sputtering a metal oxide or a metal fluoride onto the high-refractive index layer to form a low-refractive index layer, wherein a refractive index $n_S$ of the substrate, a refractive index $n_M$ of the medium-refractive index layer, and a refractive index $n_H$ of the high-refractive index layer satisfy the following expression (1):

$$\frac{n_H - 1}{n_H + 1} - \sqrt{1 - \frac{4 n_M^2 n_S}{n_M^2 (1 + n_S)^2 - (1 - n_M^2)(n_M^2 - n_S^2)}} \geq 0.02 \quad (1)$$

where the refractive index $n_S$ of the substrate, the refractive index $n_M$ of the medium-refractive index layer, and the refractive index $n_H$ of the high-refractive index layer have a relationship of $n_H > n_M > n_S$.

* * * * *